United States Patent [19]
Pelster

[11] Patent Number: 5,371,468
[45] Date of Patent: Dec. 6, 1994

[54] METHOD FOR THE DETERMINATION OF ELECTROMAGNETIC IMPEDANCES IN THE FREQUENCY RANGE FROM 1 HZ TO 10 HZ

[76] Inventor: Rolf Pelster, Auf dem Heidchen 23, 5068 Odenthal-Glöbusch, Germany

[21] Appl. No.: 986,778

[22] Filed: Dec. 8, 1992

Related U.S. Application Data

[63] Continuation-in-part of Ser. No. 830,829, Feb. 4, 1992, abandoned.

[30] Foreign Application Priority Data

Nov. 30, 1991 [DE] Germany .............................. 4139622

[51] Int. Cl.$^5$ ............................................. G01R 27/02
[52] U.S. Cl. ..................................................... 324/638
[58] Field of Search ............... 324/600, 601, 638, 639, 324/641, 647, 649, 650, 654, 657

[56] References Cited

U.S. PATENT DOCUMENTS 4,982,164  1/1991  Schiek et al. .

OTHER PUBLICATIONS

K. Küpfmüller, Einführung in die theoretische Elektrotechnik, Springer, 11th Ed., 1984, Chapter 5 (no translation).
J. R. Macdonald, Impedance Spectroscopy, J. Wiley & Sons, 1987, 1st Edition, Chapter 3.
A Generalized Theory and New Calibration Procedures for Network Analyzer Self-Calibration, H. J. Eul and B. Schiek, IEEE Transactions on Microwave Theory & Techniques, vol. 39, No. 4, Apr. 1991.
A. Rost, Messung dielektrischer Stoffeigenschaften, Vieweg, 1978, 1. Edition, Chapter 4.3 (no translation).
N.—E. Belhadj-Tahar, These de doctorat de l'Universite Pierre et Marie Curie, Paris IV, 1986 (no translation).
H. Freitag, Einführung in die Zweitortheorie, Teubner Studienskripten, 1984, 3rd Edition, Chapter 12, p. 149 (no translation).
S. F. Adam, Microwave Theory and Applications, Prentice-Hall, Inc., 1969, 1st Edition, Chapter 2.2, p. 42.
Landau and Lifshitz, Electrodynamics of Continuous Media, Pergamon Press, 1960, 1st Edition, Chapter 7, p. 193.

*Primary Examiner*—Walter E. Snow
*Attorney, Agent, or Firm*—Felfe & Lynch

[57] ABSTRACT

An unknown impedance can be determined in an analytically exact way by measuring in succession the 3 complex transmission coefficients of a transmission path, in which a measurement cell with the unknown impedance or with one of two known impedances is inserted. This is a broad-band method which takes into account all mismatches of the transmission line and of the measurement cell. Dielectric and magnetic material parameters can be determined via these impedance measurements.

15 Claims, 3 Drawing Sheets

METHOD FOR THE DETERMINATION OF ELECTROMAGNETIC IMPEDANCES IN THE FREQUENCY RANGE FROM 1 HZ TO 10 HZ

This application is a continuation-in-part application of my co-pending application Ser. No. 830,829, filed Feb. 4, 1992, now abandoned.

BACKGROUND OF THE INVENTION

Measurements of the real part $Z_1$ and the imaginary part $Z_2$ of complex electromagnetic impedances $Z=Z_1+jZ_2$ as a function of frequency and temperature are indispensible for the development and production of passive electronic components, e.g. of capacitors and coils. Furthermore, the knowledge of dielectric and magnetic material parameters is important for the development of materials or for production control. These parameters are also determined by impedance measurements.

In order to characterize an electronic component or a material, precise broad-band techniques for the determination of complex impedances are needed, which eliminates all errors from the measurement equipment including cables. As long as the wavelengths of the used electromagnetic waves are much larger than the cable lengths, the electrotechnical description will be sufficiently correct, i.e. each measurement arrangement may be considered as a linking of lumped elements. Above 1 MHz additional effects become noticeable, which are described with the help of transmission line theory. Within the framework of this theory one speaks more generally of transmission lines. (K Küpfmüller, Einführung in die theoretische Elektrotechnik, Springer, 11th Edition, 1984, Chapter 5). At all discontinuities in a transmission line, current or voltage will be reflected and therefore multiple reflections between these discontinuities will occur. Therefore, current and voltage along a transmission line will change in contrast to the electrotechnical description. But also along homogeneous lines phase variations of current and voltage become noticeable. As the phase length of a line is proportional to the frequency, the influence of these effects will increase at higher frequencies. Therefore, these effects and the effects of multiple reflections have to be taken into account for the determination of the actual voltage-current ratio which defines the impedance.

Up to now there is no precise technique for the determination of complex impedances which works in the low frequency range from 0 to 10 MHz as well as up to file microwave region of some GHz. Therefore, one has to use different techniques for a broad-band determination of impedances. This requires a lot of time and equipment for preparing and carrying out the measurements. Furthermore, the known techniques have different disadvantages in the range above 10 MHz. In the following different measurement methods in the frequency range between 0 and 10 GHz are descibed as state of technology.

a) Impedance measurement by balancing a bridge, for example auto frequency bridges, transformer ratio bridges, autobalanced bridges, LCR-meters, impedance analyzers etc. (J. R. Macdonald, Impedance Spectroscopy, J. Wiley & Sons, 1987, 1st Edition, Chapter 3).

In general no phase variations and no multiple reflections are taken into account by balancing a bridge and therefore precise measurements can be carried out only up to about 10 MHz.

b) Measurement of transmission and reflection coefficients while taking into account the influence of the feeding lines by a calibration with 3 different standards. A summary of all the different techniques is given in: A Generalized Theory and New Calibration Procedures for Network Analyzer Self-Calibration, H. J. Eul and B. Schiek, IEEE Transactions on Microwave Theory and Techniques, Vol. 39, No. 4, April 1991.

Applying these techniques the reflection- and transmission-coefficients of a transmission path, in which a measurement cell with the unknown impedance is inserted, are measured for either possible signal directions, i.e. 4 complex values per measurement frequency. The influence of the feeding lines is eliminated using a 3 step procedure, the calibration. During the calibration, in the place of the measurement cell three different standards are connected in, succession to the feeding lines, and the reflection and transmission coefficients are measured. In addition to the time and equipment needed (bridges to split off reflected signals, reversal of signal flow) there are two principal disadvantages of these techniques which limit their application and accuracy. The used standards change their properties as a function of temperature in an unknown way, so that the influence of the feeding lines may be determined only at room temperature (this is not true for techniques which use different line-lengths for the calibration. But these are no broad-band techniques and they are not realizable in the frequency range discussed here because of the large wavelengths). Therefore, precise impedance measurements can be carried out only near room temperature. The influence of the measurement cell which contains the unknown impedance is only taken into account if the cell matches the impedance of the transmission line (the phase length of the measrement cell has to be determined, for example, by an additional transmission measurement). This is an idealizing assumption which is difficult to realize and which limits the accuracy of the impedance measurement and the possible geometries of measurement cells.

c) Measurement of reflection coefficients using impedance analyzers or network analyzers (e.g. sample as termination of a coaxial line, see: A. Rost, Messung dielektrischer Stoffeigenschaften, Vieweg, 1978, 1. Edition, Chapter 4.3).

These techniques are not applicable below 1 MHz and they do not allow the resolution of loss tangents $Z_1/Z_2$ with values smaller than $10^{-1}$, in an ideal case smaller than $10^{-2}$ (see e.g. N.-E. Belhadj-Tahar, Théde doctorat de l'Université Pierre et Marie Curie, Paris IV, 1986). The influence of the feeding line is determined as described in b) using three different standards. Therefore, the same limitations are valid for temperature dependent measurements.

SUMMARY OF THE INVENTION

Now, a new, very advantageous method for the determination of the real part and the imaginary part of electromagnetic impedances in the frequency range between 1 Hz and 10 GHz, preferably between 1 Hz and 2 GHz, has been invented. The real and the imaginary part of the transmission coefficient or of an equivalent characteristic transmission parameter of a transmission path are measured. This transmission path consists of a transmission line, in which a measurement cell is inserted, and of a terminating impedance at the output side. The method is characterized by the following steps:

(a) an unknown impedance Z, which has to be determined, is realized between two electrodes of the measurement cell, which have a fixed distance during the measurement, and the resulting transmission coefficient $S_{21}^{meas}$ of the transmission path is measured; and (b) two impedances $Z_a$ and $Z_b$ with different known values are realized in succession between the same electrodes as described in (a) having the same distance as described in (a) in the place of the unknown impedance Z, and the two corresponding transmission coefficients of the transmission path, $S_{21}^a$ and $S_{21}^b$, are measured in succession. The transmission coefficients do not have to vanish and the measurement conditions have to remain unchanged; and, (c) the value of the unknown impedance is calculated from the three measured transmission coefficients and from the values of the two known impedances.

If the unknown impedance Z is connected in series to the termination impedance of the transmission path, Z is calculated from:

$$Z = \frac{Z_a S_{21}^a (S_{21}^b - S_{21}^{meas}) + Z_b S_{21}^b (S_{21}^{meas} - S_{21}^a)}{S_{21}^{meas}(S_{21}^b - S_{21}^a)} \quad (1)$$

If it is connected parallel to the termination impedance, however, Z is calculated from:

$$Z = \frac{S_{21}^{meas}(S_{21}^b - S_{21}^a)}{S_{21}^a(S_{21}^b - S_{21}^{meas})/Z_a + S_{21}^b(S_{21}^{meas} - S_{21}^a)/Z_b} \quad (2)$$

The term "realizing an impedance (known or unknown) between two electrodes" as used herein and in the claims is meant to include connecting the impedance (known or unknown) to the electrodes.

DETAILED DESCRIPTION

In general the transmission coefficients $S_{21}^a$, $S_{21}^b$ and $S_{21}^{meas}$ are functions of frequency, temperature (induced by thermal expansions of feeding lines and measurement cell) and of the electrode distance. Using modern broad-band network analyzers each transmission coefficient can be measured directly as a function of frequency before the next impedance is connected to the electrodes or realized between them. It is a peculiarity of the method that according to (b) the measurement cell remains unchanged in the transmission path and that only the impedances Z, $Z_a$ and $Z_b$ are exchanged.

The transmission coefficients $S_{21}^a$ and $S_{21}^b$ must not vanish, i.e. $S_{21}^a \neq 0$ and $S_{21}^b \neq 0$ has to hold. In the case of a series connection (Equation 1) this means $|Z_a| < \infty$ and $|Z_b| < \infty$ has to hold for the absolute values of the known impedances, so that the corresponding values of the transmission coefficients remain measurable. If the unknown impedance is connected parallel to the termination impedance of the transmission path (Equation 2), $Z_a \neq 0$ and $Z_b \neq 0$ has to hold. The expression 'known impedance' is defined as follows: the value of the impedance is known or can be determined using a known technique. In Example #1 it will be shown how to evaluate $Z_b$ from $S_{21}^a$ and $S_{21}^b$ at each frequency point in case of broad-band measurements, even if just a certain frequency behaviour of $Z_b$ is assumed. For $Z_a$ and $Z_b$ the following impedances may be chosen: shorts, ohmic resistors, capacitors with and without material between the plates, coils or combinations of these impedances, for example. The impedances $Z_a$ and $Z_b$ may be, for example, electronic components which are connected to the electrodes. They may also be realized, for example, with the help of areal electrodes which act like a plate capacitor.

The method can be applied advantageously if the unknown impedance is connected in series to the terminating impedance of the transmission path. In this case it is advantageous to choose a metallic short for one impedance, e.g. for $Z_a$. An appropriate choice for $Z_a$ and $Z_b$ is, for example, the use of a metallic short and a coil or the use of a metallic short and a capacitor. If, in addition, areal electrodes are used, the following choices of $Z_a$ and $Z_b$ are highly advantageous:

i) The use of a metallic short $Z_a = 0$ and realization of $Z_b$ with the impedance of the plate capacitor arrangement which is formed by the electrodes with an air gap in-between.

ii) The use of a metallic short $Z_a = 0$ and realization of $Z_b$ with the impedance of the electrodes with a material in-between. The material should have a frequency-independent and loss-less dielectric function in the measurement range. This might be, e.g., a spacer made from teflon or silica. It is also possible to use a material with any dielectric function. In this case the dielectric function has to be known within the measurement range used.

In general the transmission coefficients are determined by measuring the voltages at the termination impedance $Z_0$ of the transmission path and the voltages at the termination impedance of the so-called reference path as described in Example #1. Equation 1 and 2 are independent of both the transmission line impedance and of the termination impedance $Z_0$ which may be unknown. If the unknown impedance is connected in series to the termination impedance of the transmission path and if its absolute value is large, i.e. $|Z| > 20$ kΩ for example, the following procedure is very advantageous: in order to enhance the measurement accuracy below 0.1–1 MHz a large termination impedance, e.g. $Z_0 = 1$ MΩ, may be used which does not match the impedance of the transmission line, while the termination impedance of the reference path is 50Ω, for example. At frequencies above 1 MHz both termination impedances should be equal to the impedance of the transmission line. This procedure is possible using modern network analyzers with switchable termination impedances. Using these instruments the measurement can be carried out very fast and over a large frequency range.

Perfectly matched and therefore non-reflecting signal sources would supply an output voltage which is independent of the load also at higher frequencies. In this case it would be sufficient to measure only the voltages at the termination impedance $Z_0$ of the transmission path. These voltages would be equivalent characteristic transmission parameters. Then in Equation 1 or Equation 2 the transmission coefficients have to be replaced by the corresponding voltages. Up to now such broadband signal sources have not yet been designed, so that this procedure will be applicable only in a limited frequency range The method of this invention also permits the determination of dielectric and magnetic material parameters. The dielectric function of a material can be determined by measuring the impedance of a capacitor arrangement which consists of the areal metallic electrodes of the measurement cell with the material in-between. From the measured impedance the dielectric function can be calculated in a well-known way. The complex magnetic permeability of a material can be determined by measuring the impedance of a coil which contains the material (see Example #3).

The advantages of the method of this invention are:
1.) The method covers an extremely wide range of frequencies (1 Hz to 10 GHz). The upper frequency limit depends on size and geometry of the electrodes and on the construction of the measurement cell.
2.) Only transmission measurements are needed, i.e. detectors and bridges or directional couplers for the recording of reflected signals are not necessary. Therefore, less sophisticated instruments may be used and the measurement may be carried out faster.
3.) The influence of the transmission path and of the measurement cell are taken into account analytically by two transmission measurements, i.e. there are no systematic errors in the determination of the impedance due to a mathematical approximation.
4.) The measurement cell which contains the unknown impedance does not have to match the line impedance. Therefore, a lot of different measurement cells may be used. By choosing an appropriate geometry of measurement cell and electrodes the effort for the preparation of suitable samples can be kept to a minimum.
5.) Temperature dependent measurements are possible.
6.) The measurement range is very large, and the accuracy of the method is very high. Even very small impedances with $Z_1 < 1\ \Omega$ and impedances having a small loss tangent ($Z_1/Z_2 < 10^{-3}$ for measurements with modern network analyzers) can be determined in a broad frequency range.
7.) The two known impedances can be realized very easily. For the determination of the dielectric function of a material it is therefore possible to adapt the distance of the electrodes to the length of the samples available. This will decrease the work needed for sample preparation.
8.) If a capacitor is used to determine the dielectric function of a material, the method gives an implicit correction of the fringing fields. Therefore, it is not necessary to use a capacitor with a guard ring or to work with mathematical corrections which are only of approximate validity.

EXAMPLE #1

Figure 1:
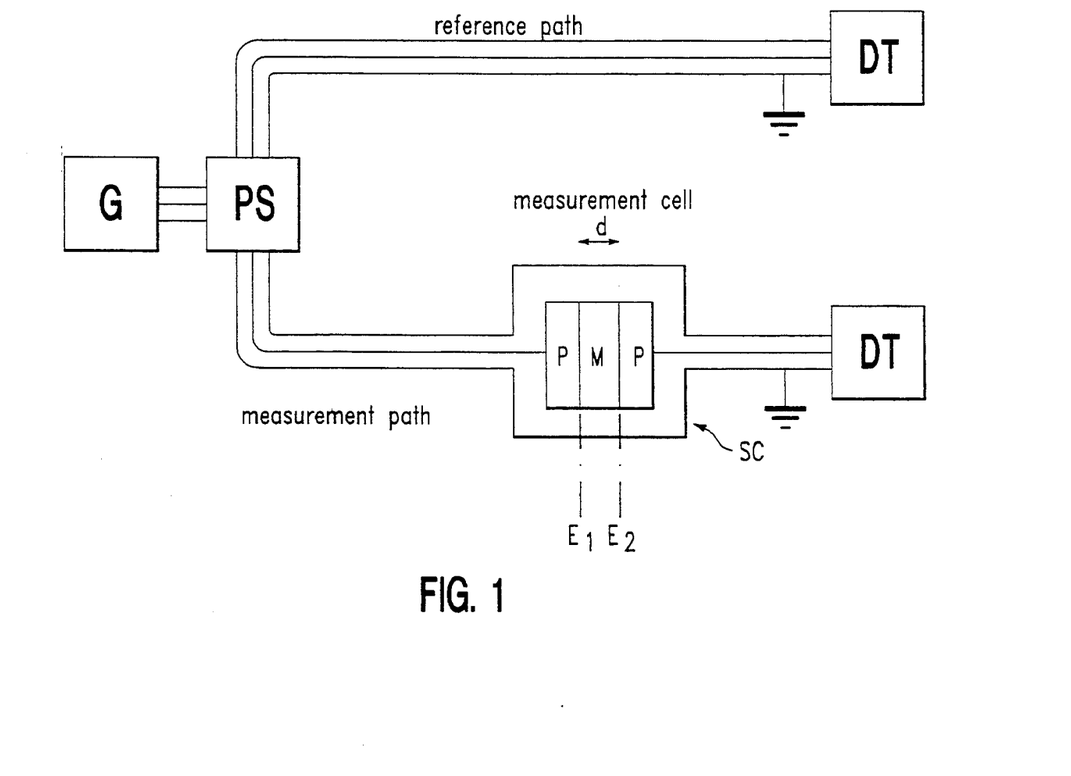
FIG. 1 is a schematic diagram showing a measurement arrangement for the determination of the impedance of a plate capacitor.

Referring to FIG. 1 the invention will be illustrated, using the example of the determination of the impedance of a plate capacitor. Between the circular capacitor plates P there is a sample of a material M having a cylindrical shape with radius $a_p$ and length d. The complex dielectric function of the material has to be evaluated via the determination of the impedance. The measurement cell consists of a shielding cover SC and of the plate capacitor which is connected in series to a coaxial transmission line (FIG. 1). The capacitor plates P are the areal electrodes. A voltage source G supplies a sinusoidal signal with frequency $v$. A power splitter PS splits up the signal into reference path and measuring path, in which the measurement cell is inserted. Magnitude and phase (or real and imaginary part) of the voltage ratio at the termination impedances of reference and measurement path are measured, i.e. the complex transmission coefficient of the transmission path between power splitter PS and the detector DT of the measurement path. The transmission coefficient is determined in reference to the voltage measured in the detector DT of the reference path. The termination impedances are realized by the detectors themselves.

Figure 2:
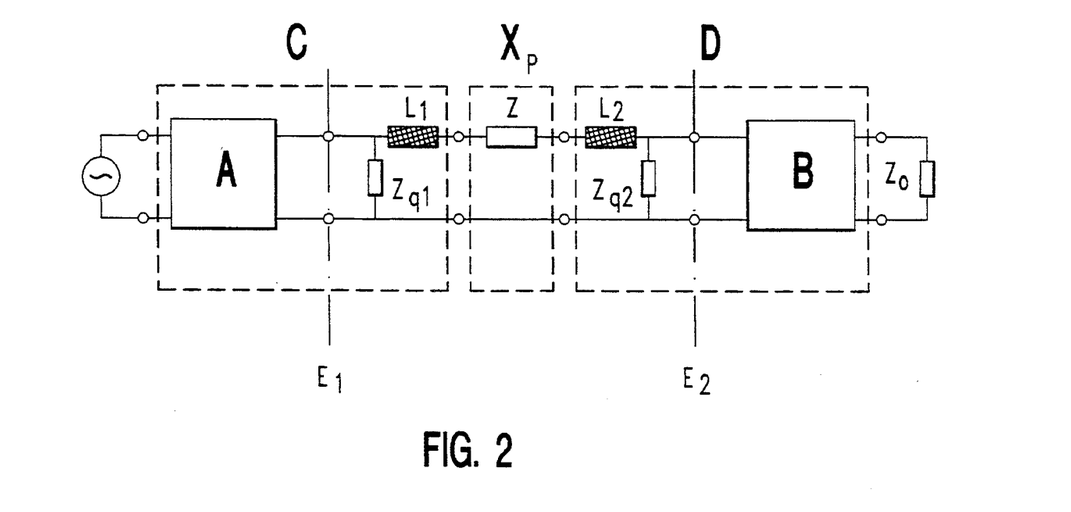
FIG. 2 is a schematic diagram showing the corresponding equivalent circuit.

The equivalent circuit of the arrangement is shown in FIG. 2. The following symbols are used in the figures and in the text:

P capacitor plates having a circular cross-section

SC shielding cover of the measurement cell having a cylindrical shape d distance of the capacitor plates, i.e. length of the material M sample of a material Z unknown complex impedance, i.e. impedance of the plate capacitor with the material M between the plates $E_1, E_2$ reference planes in which the surfaces of the capacitor plates P are located G voltage source DT detector PS power splitter $Z_0$ complex termination impedance of the measurement path A,B complex cascading matrices of the error two-ports, which represent the influence of the coaxial transmission line and of the measurement arrangement up to the reference planes $E_1$ or $E_2$ respectively $L_1, L_2$ complex inductances in the region between $E_1$ and $E_2$ $Z_{q1}, Z_{q2}$ complex impedances between center conductor and shielding cover in the region between $E_1$ and $E_2$ C,D complex cascading matrices of the extended error two-ports, which new also include the influence of $Z_{q1}, Z_{q2}$, $L_1$ and $L_2$ $X_p$ complex cascading matrix of the two-port, which only contains the impedance Z T complex cascading matrix of the transmission path. $T = C \cdot X_p \cdot D$ holds.

$v$ measurement frequency $\omega$ angular frquency, $\omega = 2\pi v$ $Z_a, Z_b$ complex known impedances $S_{21}^{meas}$ measured complex transmission coefficient, when the material M is placed between the capacitor plates $S_{21}^a, S_{21}^b$ measured complex transmission coefficient, when the impedance $Z_a$ or $Z_b$ is placed between the capacitor plates or realized between them $\epsilon$ complex relative dielectric function of the material $\epsilon_0$ permittivity of vacuum, $\epsilon_0 = 8.854 \cdot 10^{-12}$ F/m
$a_e$ radius of the capacitor plates
$A_e$ cross-sectional area of a capacitor plate, $A_p = \pi a_p^2 \leq A_e$
$a_p$ radius of the material, $a_p \leq a_e$
$A_p$ cross-sectional area of the material, $A_p = \pi a_p^2 \leq A_e$
b inner radius of the cylindrical shielding cover of the measurement cell
$C_{fr}$ fringing capacity of the capacitor because of boundary effects
$C_e$ capacitance of the capacitor neglecting boundary effects, when no material is placed between the plates, $C_e = \epsilon_0 A_e/d$
$C_b$ capacitance of the capacitor, when no material is placed between the plates, $C_b = C_e + C_{fr}$
$\mu$ complex relative magnetic permeability of the material
k complex wave vector, $k = \omega/c \sqrt{\epsilon \mu}$
c speed of light, $c = 2.9979 \cdot 10^8$ m/s
$J_0$ complex Bessel function of 0th order
$J_1$ complex Bessel function of 1st order The cascading matrices A,B,C,D,$X_p$ and T are complex 2×2-matrices: their elements are characterized by double indices. The four elements of the matrix T are for example: $T_{11}, T_{12}, T_{21}$ and $T_{22}$. The impedances $Z_{q1}$ and $Z_{q2}$ are mainly given by radiation losses at higher frequencies and by capacitances between the shielding cover of the measurement cell and the edges of the electrode surfaces which are located in the reference planes $E_1$ and $E_2$ respectively. In the frequency range discussed here they are independent of the impedance Z. $L_1$ and $L_2$ are self-inductances of the arrrangement in the region between $E_1$ and $E_2$; they are given by the geometry of the measurement cell. Therefore, the cascading matrices A and B may be extended to give a new simplified equivalent circuit. Now, the impedance Z is connected in series between the two error two-ports described by the cascading matrices C and D. The matrices C and D depend on the distance d of the capacitor plates, because $Z_{q1}, Z_{q2}, L_1$ and $L_2$ do as well.

Between the reflection and transmission coefficients of a two-port—the so-called S-parameters—and the elements of the corresponding cascading matrix X, the following relation holds (H. Freitag, Einführung in die Zweitortheorie, Teubner Studienskripten, 1984, 3rd Edition, Chapter 12, p. 149):

$$X_{11} = -S_{11}S_{22}/S_{21} + S_{12}$$

$$X_{12} = S_{11}/S_{21}$$

$$X_{21} = -S_{22}/S_{21}$$

$$X_{22} = 1/S_{21}$$

with
$S_{21}, S_{12}$ transmission coefficients of the two-port
$S_{11}, S_{22}$ reflection coefficient of the two-port for the two possible directions of signal flow, respectively For the two-port, which consists only of the impedance Z of the sample between the two-ports with the cascading matrices C and D, the S-parameters are:

$$S_{21}^0 = S_{12}^0 = \frac{1}{\frac{Z}{2Z_0} + 1}$$

$$S_{11}^0 = S_{22}^0 = S_{21}^0 \cdot \frac{Z}{2Z_0}$$

Let $X_p$ be the corresponding cascading matrix. The cascading matrix of the whole system is obtained by multiplying the cascading matrices of the two-ports connected in series:

$$T = C \cdot X_p \cdot D$$

$1/T_{22}$ is the measured transmission coefficient $S_{21}^{meas}$ of the whole system and therefore $$S_{21}^{meas} = \frac{N}{KZ + 1} \quad (3)$$

with $$N = \frac{1}{C_{21}D_{12} + C_{22}D_{22}}$$

$$K = \frac{N}{2Z_0} \cdot (-C_{21}D_{12} + C_{22}D_{22} + C_{21}D_{22} - C_{22}D_{12})$$

N and K are functions of frequency, temperature (induced by thermal expansions of feeding lines and measurement cell) and of the plate distance d. They have to be determined by two additional transmission measurements—the so-called calibration. For this purpose two measurements with two different impedances $Z_a$ and $Z_b$, replacing the impedance Z between the electrodes, are sufficient, provided that the functions N and K remain unchanged. To ensure that the corresponding transmission coefficients are measurable, i.e. they do not vanish, $|Z_a| < \infty$ and $|Z_b| < \infty$ has to hold for the absolute values of the impedances.

Let $S_{21}^a$ and $S_{21}^b$ be the measured transmission coefficients of the arrangement with the impedances $Z_a$ or $Z_b$, respectively, in the place of the unknown impedance Z. From Equation 3 the equation for the determination of Z is obtained:

$$Z = \frac{Z_a S_{21}^a (S_{21}^b - S_{21}^{meas}) + Z_b S_{21}^b (S_{21}^{meas} - S_{21}^a)}{S_{21}^{meas}(S_{21}^b - S_{21}^a)} \quad (4)$$

For this procedure the conditions under which the transmission coefficients are measured must not be changed. Only the impedances Z, $Z_a$ and $Z_b$ are exchanged, the measurement arrangement remains unchanged, especially the electrode distance.

As $Z_a$ a cylindrical metallic short of length d and radius $a \leq a_e$ is choosen and therefore $Z_a = 0$ holds. The phase length of the short has already been taken into account in the cascading matrices C and D. The capacitance between the shielding cover and the edges of the electrode surfaces located in the reference planes $E_1$ and $E_2$ equals the capacity between the short and the shielding cover, provided the plate distance is small, e.g. d=1 mm. In this case the cascading matrices C and D remain unchanged as demanded. For larger values of d this may be achieved approximatly by a large distance between capacitor plates and shielding cover; then the impedances $Z_{q1}$ and $Z_{q2}$ are very large and do not influence the signal of the measurement path. Equation 4 is simplified to:

$$Z = \frac{\frac{S_{21}^a}{S_{21}^{meas}} - 1}{\frac{S_{21}^a}{S_{21}^b} - 1} \cdot Z_b \quad (5)$$

$Z_b$ is realized by the impedance of the unloaded plate capacitor with the same plate distance d. Let $C_b$ be the capacitance of the unloaded capacitor:

$$Z_b = \frac{1}{j\omega C_b}$$

The value of $C_b$ is real and independent of frequency, provided $\omega a_e/c < 0.3$ holds: this inequality corresponds to a maximum deviation of about 1% at the highest frequency (A. Rost, Messung dielektrischer Stoffeigenschaften, Vieweg, 1978, 1st Edition, Chapter 4.3, p. 133), i.e. for a plate radius of $a_e = 6.5$ mm up to about 2 GHz. The real part $Z_1$ and the imaginary part $Z_2$ of the impedance Z are both proportional to the purely imaginary value of $Z_b$, therefore the loss tangent $Z_1/Z_2$ is independent of $Z_b$. Even if the impedance $Z_b$ is unknown, the loss tangent can be determined, which would also be true if $Z_b$ were purely real.

For example $C_b$ may be determined directly from the measurements of $S_{21}^a$ and $S_{21}^b$, if the measurements of the transmission coefficients are carried out over a larger frequency range containing also frequencies below 1 MHz. Below 1 MHz reflections in the feeding lines are hardly noticeable. So for the frequency-independent value of $C_b$ the following relation is obtained from Equation 3 with $K = 1/(2Z_0)$ (so-called normalize):

$$C_b = \frac{1}{j\omega 2Z_o \left( \frac{S_{21}^a}{S_{21}^b} - 1 \right)} \text{ for } \nu < 1 \text{ MHz}$$

By this equation $Z_b$ is determined for all frequencies and the impedance Z is calculated according to Equation 5. In the limited frequency range below 0.1-1 MHz, Z may be calculated using the following formula $$Z = 2Z_o \left( \frac{S_{21}^a}{S_{21}^{meas}} - 1 \right)$$

provided the value of Z is sufficiently small, e.g. $|Z| < 20$ kΩ. For higher impedances the use of Equation 5 is advantageous also for frequencies below 0.1-1 MHz.

In principle it is possible to take any complex impedance as $Z_b$ in Equation 5, provided $S_{21}^a \neq S_{21}^b$. In this case the values have to be known for all measurement frequencies. A temperature dependent measurement of $S_{21}^a$ and $S_{21}^b$ is possible, because of the simplicity of the impedances $Z_a$ and $Z_b$. So Z can be determined as a function of frequency and temperature.

The complex dielectric function e of the material is calculated from the impedance Z by solving the equation $$\epsilon \cdot \frac{2J_1(ka_p)}{ka_p J_o(ka_p)} - \frac{d}{j\omega\epsilon_o \pi a_p^2} \left( \frac{1}{Z} - j\omega \left( \epsilon_o \pi \frac{a_e^2 - a_p^2}{d} + C_{fr} \right) \right) = 0 \quad (6)$$

(A. Rost, Messung dielektrischer Stoffeigenschaften, Vieweg, 1978, 1st Edition, Chapter 4.3, p. 133).

The wave vector k is a function of $\epsilon$, too, because $k = \sqrt{\epsilon\mu} \cdot \omega/c$. So $\epsilon$ can be determined for example by a numerical search for zeros. $C_{fr}$ may be determined from $C_b$, because $$C_{fr} = C_b - C_e$$

with $C_e$ being the theoretical capacity of the unloaded capacitor neglecting fringing fields, i.e. $C_e = \epsilon_0 A_e/d$.

In the case of $|ka_p| << 1$ Equation 6 simply becomes $$\epsilon = \frac{d}{j\omega\epsilon_o A_p} \left( \frac{1}{Z} - j\omega \left( \epsilon_o \frac{A_e - A_p}{d} + C_{fr} \right) \right)$$

which is the well-known low-frequency formula for plate capacitors. Then also samples with non-circular cross-sections may be investigated.

For strongly magnetic materials ($|\mu| >> 1$) the inequality $|ka_p| << 1$ not fulfilled at high frequencies. If the magnetic permeability $\mu$ of the material is unknown, measurements may be carried out using two samples of the same length d but of different radii, to determine the independent quantities $\epsilon$ and $\mu$ at these higher frequencies. This gives two equations of the same form as Equation 6, but for different radii $a_p$, which allow the calculation of the two unknowns $\epsilon$ and $\mu$.

EXAMPLE #2

Measurement arrangement and procedure are assumed to be similar to Example #1. But as $Z_b$ the impedance of a loaded plate capacitor is used. The material between the plates should have no losses, i.e. its dielectric function $\epsilon_b$ is real and frequency-independent. Its cross-sectional area is $A_b$ (with $A_b \leq A_e$). This may be, for example, a ring-shaped spacer of length d made from teflon or silica. The fringing capacity is now given by $$C_{fr} = C_b - \epsilon_o \frac{A_e + (\epsilon_b - 1)A_b}{d}$$

whereas all other formulas of Example #1 remain valid.

Figure 3:
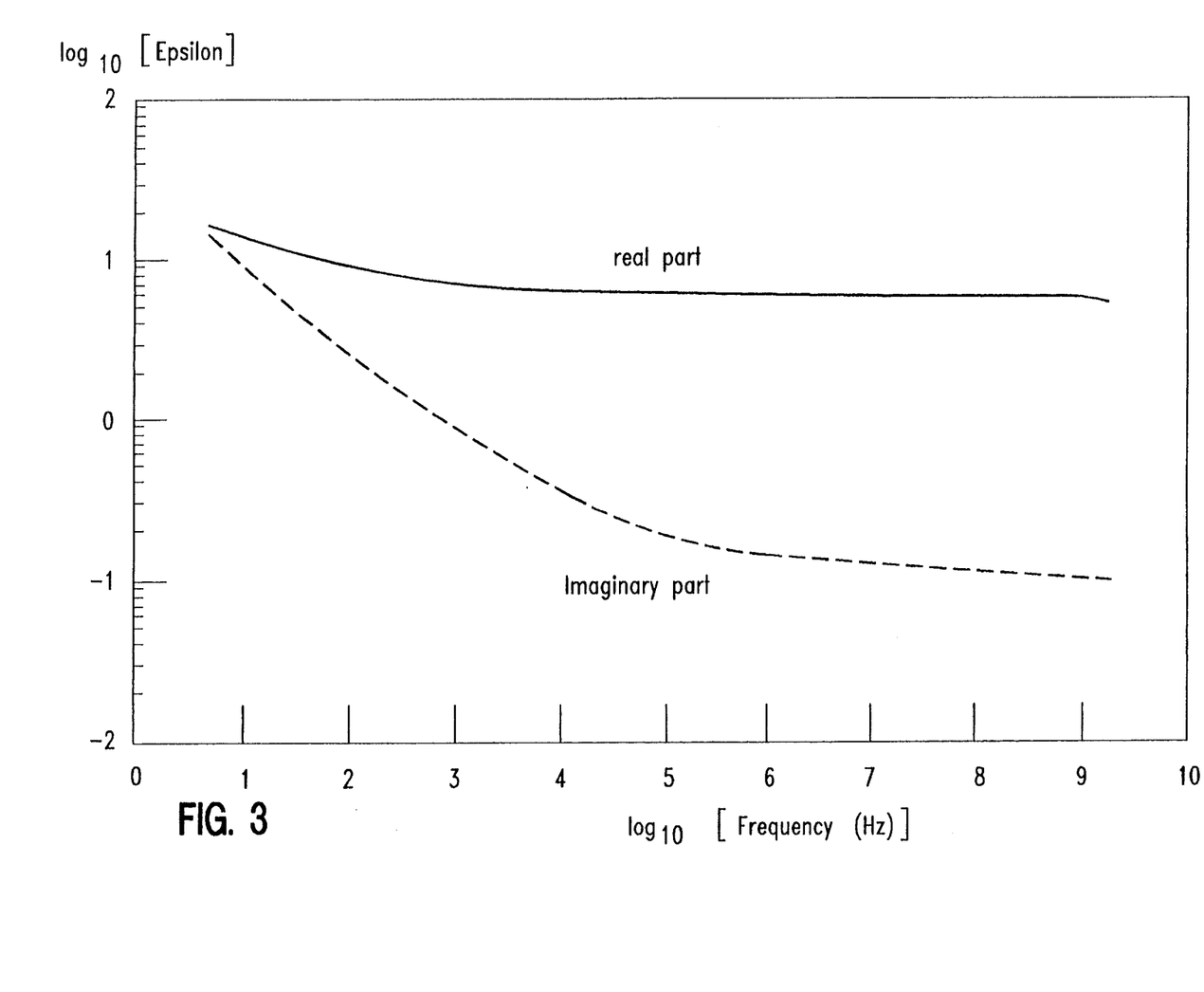
FIG. 3 is a graph representing the dielectric function of a ceramic sample, which was determined by an impedance measurement according to the method of the invention.

In FIG. 3 the result of a measurement on a ceramic sample is shown. Real and imaginary part of $\epsilon$ as a function of frequency are displayed in double-logarithmic plot, as calculated according to Equation 6 from the determined impedance of the plate capacitor loaded with the sample. The extremely broad frequency range and the high resolution of the can easily be observed.

The measurement of the transmission coefficients were carried out using two network analyzers (HP3577B: 5 Hz–200 MHz/HP8510B: 80 MHz–2 GHz). The radius of the capacitor plates and the sample was $a_e = a_p = 6.5$ mm, the distance between the plates d = 1 mm. The inner radius of the cylindrical shielding cover was b = 15 min. A metallic short was taken as impedance $Z_a$, as $Z_b$ the impedance of the capacitor loaded with a ring-shaped spacer made from teflon was used. The maximum measurement frequency is determined by the geometrical quantities $a_e$, b and d as well as by the material parameters $\epsilon$ and $\mu$. The following inequalities have to hold:

$$\nu < \frac{c}{\pi(a_e + b)}$$

$$\nu << \frac{c}{2\pi d |\sqrt{\epsilon\mu}|}$$

The first inequality indicates the frequency at which higher modes, i.e. altered electromagnetical field distributions, become relevant in the region of the sample. These higher modes do not allow an unambigious determination of the impedance (S. F. Adam, Microwave Theory and Applications, Prentice-Hall, Inc., 1969, 1st Edition, Chapter 2.2, p. 42). The second inequality has to hold, because Equation 6 for the determination of the dielectric function was derived under the assumption that the electric field between the capacitor plates is purely perpendicular to the plates. The field distortions increase with increasing plate distance, and therefore $|kd| << 1$ has to hold. Decreasing the radii $a_e$ and b and using thinner samples will therefore increase the maximum measurement frequency, which indicates the limit for the determination of $\epsilon$.

EXAMPLE #3

Figure 4:
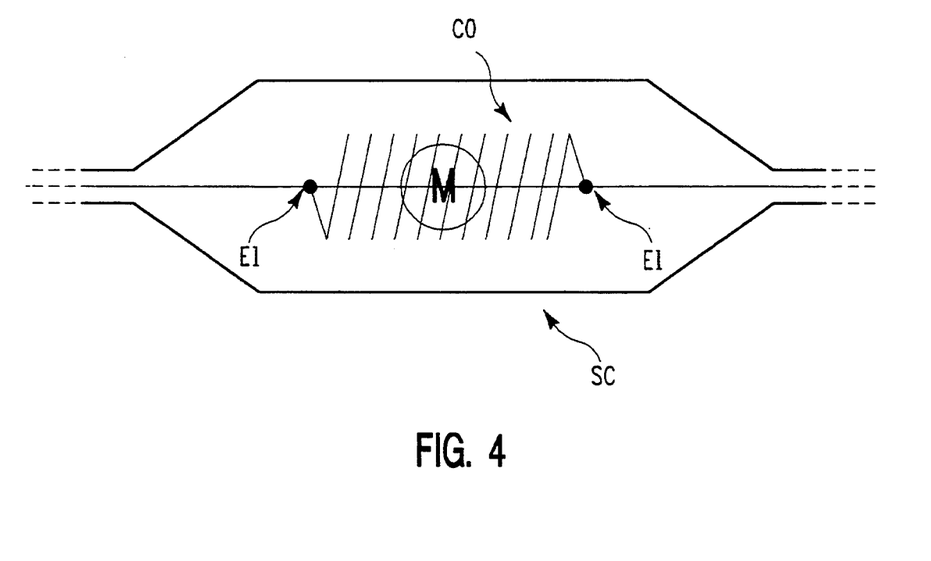
FIG. 4 is a schematic diagram showing a measurement arrangement for the determination of the complex impedance of a coil containing a magnetic material.
Figure 5:
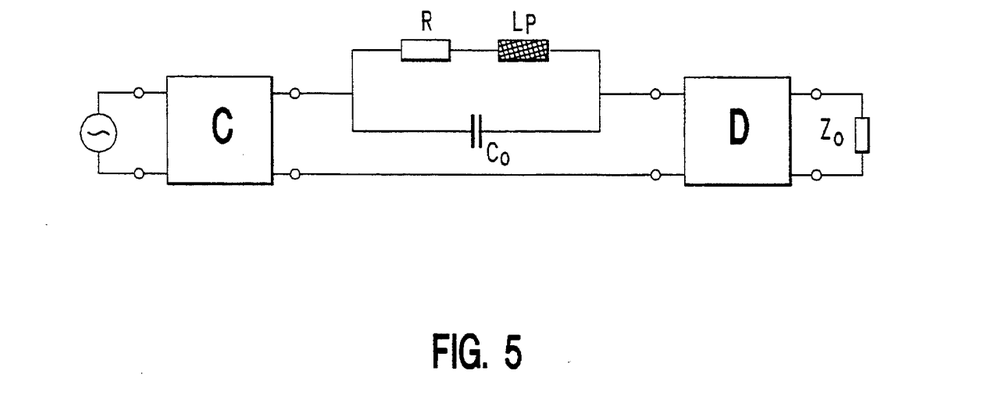
FIG. 5 is a schematic diagram showing the corresponding equivalent circuit.

Referring to FIG. 4 the invention will be illustrated, using the example of the determination of the complex inductance of a coil CO containing a material M with a complex magnetic permeability. This may be a sample of a material or a ferrite core, for example, coil is connected to two electrodes El inside the measurement cell (see FIG. 4). The other parts of the measurement arrangement are assumed to be as described in Example #1. The equivalent circuit of the arrangement is displayed in FIG. 5. The impedance of the coil consists of an ohmic resistance R connected in series to a complex inductance $L_p$, induced by the material M (the inductance of the unloaded coil, $L_o$, is a real quantity). A capacitance $C_o$ is connected parallel to R and Lo taking into account the eigen-resonance of the coil. $C_o$ is mainly induced by the capacitances between the turns of the coil. If the sample is centered in the coil and if its cross-sectional area, is smaller than the cross-sectional area of the coil, the value of $C_o$ is the same for the loaded and for the empty coil. In addition to the quantities defined in Example #1 the following symbols are used:

CO coil
El electrodes of the measurement cell for the connection of the coil
R ohmic resistance of the coil
$C_o$ capacitance of the coil
$L_o$ inductance of the unloaded coil
$L_p$ complex inductance of the coil loaded with the material M
f ratio of the volume of the material and the volume of the coil
factor of demagnetization
$\chi$ complex magnetic susceptibility, $\chi = \mu - 1$ If the coil is replaced by a metallic short of the same length, $Z_a = 0$ holds and Equation 5 can be used. To keep the capacitance between the inner conductor and the shielding cover constant as in Example #1, a metallic cylinder may be used as short, having the same inner and outer radius as the coil.

The unloaded coil is used as impedance $Z_b$:

$$Z_b = \frac{R + j\omega L_o}{1 - \omega^2 C_o L_o + j\omega C_o R}$$

The quantities $L_o, C_o$ and R may be determined as follows:

For $\nu < 1$ MHz in general $Z_b = R + i\omega L_o$ holds; in this frequency region multiple reflections are negligible and therefore:

$$L_o = \frac{1}{j\omega} \cdot \left\{ 2Z_o \left( \frac{S_{21}^a}{S_{21}^b} - 1 \right) - R \right\}$$

At the resonance frequency $$\omega_{res}^2 = 1/(L_o C_o)$$

the ratio $S_{21}^b/S_{21}^a$ reaches its minimum (for R=0 independent of multiple reflections), so that the above relation allows the determination Co. In the case of $\omega^2 C_o L_o << 1$ all the equations may be simplified using $C_o = 0$. The resistance R of the coil becomes frequency dependent above 1 MHz caused by the skin-effect. Generally in this range $\omega L_o >> R$ is fulfilled and R may be determined using a simple ohmmeter.

So $Z_b$ can be calculated from R, $L_o$ and $C_o$. The impedance Z of the coil loaded with the material is then determined from the measured transmission coefficients $S_{21}^{meas}$, $S_{21}^a$ and $S_{21}^b$ using Equation 5. In the low frequency range multiple reflections are negligible and $\omega L_o << 1$ and $S_{21}^a = S_{21}^b$ hold. Therefore, the equation $$Z = 2Z_o \left( \frac{S_{21}^a}{S_{21}^{meas}} - 1 \right)$$

is used. The complex inductance of the loaded coil is given by $$L_p = \frac{Z(1 + j\omega C_o R) - R}{j\omega + \omega^2 C_o Z}$$

Calculating the magnetic field energy inside the coil, the complex relative permeability $\mu$ is determined from $L_p$. Let $a_M$ be the largest dimension of the sample (in the case of a sphere this will be the radius). For $|ka_M| << 1$ the following equation for $\mu = 1 + \chi$ is obtained:

$$0 = L_p - L_o \cdot \left\{ (1 - f) + f \frac{1 + \chi}{(1 + N\chi)^2} \right\}$$

In this calculation the external field of the magnetized sample has been neglected. If the inequality $|ka_M| << 1$ is no longer fulfilled, the influence of eddy currents inside the material also has to be taken into account (examples for different geometries can be found in: Landau and Lifshitz, Electrodynamics of Continuous Media, Pergamon Press, 1960, 1st Edition, Chapter 7, p. 193).

EXAMPLE #4

Measurement arrangement and procedure are assumed to be similar to Example #2. But the length $d_s$ of the metallic short and the length $d_c$ of the insulating spacer may differ from each other and from the length d of the unknown impedance. If the electrodes are now pressed against the surfaces of the short or the spacer, the change in the length of the transmission line will cause a simple phase shift $\Delta\phi$ of the measured transmission coefficients. Using the convention, that for the phase of a coaxial air-line $$\frac{d\phi}{d\omega} < 0$$

holds, we get $$\Delta\phi_s = \frac{\omega}{c}(d_s - d)$$

for the measurement with the metallic short and $$\Delta\phi_c = \frac{\omega}{c}(d_c - d)$$

for the measurement with the spacer. Therefore, the electrode distance can be kept constant mathematically by a corresponding phase shift of the measured transmission coefficients $S_{21}{}^a$ and $S_{21}{}^b$ respectively. For the calculation of the value of the unknown impedance $S_{21}{}^a$ is replaced by $S_{21}{}^a \cdot e^{j\Delta\phi_s}$ and $S_{21}{}^b$ by $S_{21}{}^b \cdot e^{j\Delta\phi_c}$. It is also possible to choose $d_s = 0$, i.e. to press together the electrodes for the measurement of $S_{21}{}^a$.

What is claimed is:

1. A method for the determination of electromagnetic impedances in the frequency range between 1 Hz and 10 GHz by measuring the real and the imaginary part of the transmission coefficient or of an equivalent characteristic transmission parameter of a transmission path, said transmission path comprising a transmission line, including a measurement cell, and a terminating impedance at an output side; said method comprising the steps of:
   (a) realizing an unknown impedance, which has to be determined, between two electrodes of said measurement cell which have a fixed distance during the measurement, and measuring only the one resulting transmission coefficient of the transmission path for said unknown impedance;
   (b) realizing in succession two impedances with different known values between the same electrodes as described in (a) having the same distance as described in (a) in the place of the unknown impedance, and measuring under else unchanged conditions like in (a) in succession the two corresponding transmission coefficients of the transmission path, while said two known impedances are chosen, so that the corresponding transmission coefficients of the transmission path do not vanish; and,
   (c) calculating the value of said unknown impedance from said three measured transmission coefficients and from the impedance values of said two known impedances.

2. A method in accordance with claim 1, in which the step of realizing an unknown impedance includes
   (a) placing said unknown impedance between two areal metal electrodes of said measurement cell and thereby connecting said unknown impedance in series to said termination impedance of the transmission path; and in which the step of realizing in succession two impedances with different known values comprises
   (b) realizing said known impedances by a metallic short between said electrodes and by said electrodes themselves with an air gap in-between.

3. A method in accordance with claim 1, in which the step of realizing an unknown impedance includes
   (a) placing said unknown impedance between two areal metal electrodes of the measurement cell and thereby connecting said unknown impedance in series to the termination impedance of the transmission path; and in which the step of realizing in succession two impedances with different known values comprises
   (b) realizing said known impedances by a metallic short between the electrodes and by the electrodes themselves with a material in-between having any, but within the measurement range, loss-less and frequency independent dielectric function.

4. A method in accordance with claim 1, in which the step of realizing an unknown impedance includes
   (a) placing said unknown impedance between two areal metal electrodes of the measurement cell and thereby connecting said unknown impedance in series to the termination impedance of the transmission path; and in which the step of realizing in succession two impedances with different known values comprises
   (b) realizing said known impedances by a metallic short between the electrodes and by the electrodes themselves with a material in-between having any, but within the measurement range, known dielectric function.

5. A method in accordance with claim 1, in which the step of realizing an unknown impedance includes
   (a) connecting said unknown impedance in series to the termination impedance of the transmission path; and in which the step of realizing in succession two impedances with different known values comprises
   (b) realizing said known impedances by a metallic short between the electrodes and by a coil between the electrodes.

6. A method in accordance with claim 1 for the determination of the real and imaginary part of the dielectric function of a material, which includes determining the impedance of a capacitor arrangement, which consists of the areal electrodes of the measurement cell and of a material placed between these electrodes.

7. A method in accordance with claim 1 for the determination of the real and the imaginary part of the magnetic permeability of a material, which includes determining the impedance of a coil containing said material having said magnetic permeability.

8. A method in accordance with claim 1 in which the calculating step includes using computer means for calculating the value of said unknown impedance.

9. A method for the determination of electromagnetic impedances in the frequency range between 1 Hz and 10 GHz by measuring the real and the imaginary part of the transmission coefficient or of an equivalent characteristic transmission parameter of a transmission path, said transmission path comprising a transmission line, including a measurement cell, and a terminating impedance at an output side; said method comprising the steps of:
- (a) realizing an unknown impedance, which has to be determined, between two electrodes of said measurement cell and measuring only the one resulting transmission coefficient of the transmission path for said unknown impedance;
- (b) realizing in succession two impedances with different known values and with possibly different geometrical lengths between the same electrodes as described in (a) in the place of the unknown impedance, and measuring under else unchanged conditions like in
- (a) in succession the two corresponding transmission coefficients of the transmission path, while said two known impedances are chosen, so that the corresponding transmission coefficients of the transmission path do not vanish, and realizing a constant electrode distance mathematically by correcting the phases of the measured transmission coefficients corresponding to the differences of the geometrical lengths of the respective known impedances and the unknown impedance; and,
- (c) calculating the value of said unknown impedance from said three measured transmission coefficients and from the impedance values of said two known impedances.

10. A method in accordance with claim 9, in which the step of realizing an unknown impedance between two electrodes of said measurement cell comprises
- (a) placing said unknown impedance between two areal metal electrodes of said measurement cell and thereby connecting said unknown impedance in series to said termination impedance of the transmission path; and which method includes
- (b) realizing said known impedances by a short-circuit between said electrodes and by said electrodes themselves with an air gap in-between.

11. A method in accordance with claim 9, in which the step of realizing an unknown impedance between two electrodes of said measurement cell comprises
- (a) placing said unknown impedance between two areal metal electrodes of the measurement cell and thereby connecting said unknown impedance in series to the termination impedance of the transmission path; and which method includes
- (b) realizing said known impedances by a short-circuit between the electrodes and by the electrodes themselves with a material in-between having any, but within the measurement range, loss-less and frequency independent dielectric function.

12. A method in accordance with claim 9, in which the step of realizing an unknown impedance between two electrodes of said measurement cell comprises
- (a) placing said unknown impedance between two areal metal electrodes of the measurement cell and thereby connecting said unknown impedance in series to the termination impedance of the transmission path; and which method includes
- (b) realizing said known impedances by a short-circuit between the electrodes and by the electrodes themselves with a material in-between having any, but within the measurement range, known dielectric function.

13. A method in accordance with claim 9 for the determination of the real and imaginary part of the dielectric function of a material having an unknown impedance, which includes determining the impedance of a capacitor arrangement, which consists of the areal electrodes of the measurement cell and of a material between these electrodes.

14. A method in accordance with claim 9, in which the calculating step includes computer means for calculating the value of said unknown impedance.

15. A method in accordance with claim 9, in which the step of realizing the constant electrode distance mathematically includes using computer means for correcting said phases.

* * * * *

UNITED STATES PATENT AND TRADEMARK OFFICE
CERTIFICATE OF CORRECTION

PATENT NO. : 5,371,468
DATED : December 6, 1994
INVENTOR(S) : Pelster

It is certified that error appears in the above-indentified patent and that said Letters Patent is hereby corrected as shown below:

Title page, change "10 HZ" to -- 10 GHz --.

Col. 1, line 4: change "10 HZ" to -- 10 GHz --.

Col. 1, line 51: change "file" to -- the --.

Col. 7, lines 3-4: change "$A_p = -\pi a_p^2 \leq A_e$" to -- $A_e = \pi a_e^2$ --.

UNITED STATES PATENT AND TRADEMARK OFFICE
CERTIFICATE OF CORRECTION

PATENT NO. : 5,371,468
DATED : December 6, 1994
INVENTOR(S) : Pelster

It is certified that error appears in the above-indentified patent and that said Letters Patent is hereby corrected as shown below:

Col. 7, line 19:   change "$k=\omega/c\sqrt{\epsilon\mu}$" to -- $k=\omega/c\sqrt{\epsilon\mu}$ --.

Col. 9, line 66:   change "e" to -- $\epsilon$ --.

Col. 10, line 20:  change "$|ka_p<<1$" to -- $|ka_p|<<1$ --.

Col. 10, line 31:  change "$|ka_p<<1$" to -- $|ka_p|<<1$ is --.

Col. 11, line 35:  change "example, coil" to -- example. The coil --.

Col. 11, line 63:  change "factor" to -- $\hat{N}$ factor --.

Col. 12, line 56:  change "$|ka_M<<1$" to -- $|ka_M|<<1$ --.

Signed and Sealed this

Thirteenth Day of June, 1995

*Attest:*

BRUCE LEHMAN

*Attesting Officer*       *Commissioner of Patents and Trademarks*